United States Patent [19]

Fiorina et al.

[11] Patent Number: 4,853,833
[45] Date of Patent: Aug. 1, 1989

[54] FILTER UNIT WITH ELECTROCHEMICAL CAPACITORS FOR A STATIC POWER CONVERTER

[75] Inventors: Jean-Noël Fiorina, Seyssinet Pariset; Hervé Denis, Echirolles, both of France

[73] Assignee: Merlin Gerin, France

[21] Appl. No.: 163,255

[22] Filed: Mar. 2, 1988

[30] Foreign Application Priority Data

Mar. 16, 1987 [FR] France ................................ 87 03712

[51] Int. Cl.$^4$ ............................................ H02M 1/14
[52] U.S. Cl. ...................... 363/47; 333/172; 361/306
[58] Field of Search ............ 363/37, 45, 46, 47, 363/48; 333/168, 172, 185, 187; 361/306, 328, 330, 331, 417, 419, 420, 429

[56] References Cited

U.S. PATENT DOCUMENTS

| | | | |
|---|---|---|---|
| 3,402,372 | 9/1968 | Wasyluk | 333/172 |
| 3,593,066 | 7/1971 | Norman, Sr. | 361/306 X |
| 4,695,939 | 9/1987 | Canay | 363/39 |

FOREIGN PATENT DOCUMENTS

| | | |
|---|---|---|
| 2738613 | 3/1979 | Fed. Rep. of Germany ...... 333/168 |
| 1409260 | 3/1979 | France . |
| 446559 | 5/1936 | United Kingdom . |

Primary Examiner—Patrick R. Salce
Assistant Examiner—Kristine Peckman
Attorney, Agent, or Firm—Arnold, White & Durkee

[57] ABSTRACT

A filter unit for a static converter, notably an inverter, comprises at least one module having four capacitors arranged on a support with a square base in two groups connected in parallel to the power supply terminals of opposite polarities, each group comprising two series-mounted capacitors. The voltage at the mid-points of the two groups is fixed by a voltage divider comprising two balancing resistors, and an auxiliary impedance formed by the intermediate part of the connecting device. The support base is provided with coupling means to enable modular assembly by associating several modules identical on the four sides of the base.

7 Claims, 5 Drawing Sheets

20 KVA

40 KVA

60 KVA

80 KVA

FILTER UNIT WITH ELECTROCHEMICAL CAPACITORS FOR A STATIC POWER CONVERTER

BACKGROUND OF THE INVENTION

The invention relates to a filter unit for a static power converter, comprising a plurality of electrochemical capacitors formed by coils with parallel axes, positioned on a mechanical support, and cooperating at the opposite end with an electrical connecting device, said capacitors being divided into different groups connected in parallel to the power supply terminals, each group comprising at least two series-mounted capacitors, whose mid-point voltage is fixed by a voltage divider with balancing resistors R.

FIG. 1 shows the wiring diagram of a filter cell 10 of the prior art with two electrochemical capacitors C1 and C2 parallel connected by a connecting device. Z1 and Z2 represent the partial impedances of the bars connecting the connecting device in parallel. When the cell 10 is supplied between the points A and D, the distribution of the currents depends only on the impedances of the two capacitors C1 and C2, given that each capacitor is connected to the opposing polarities of the power supply by a connecting impedance having a value of 2 Z1+Z2. The equivalent diagram between the points A and D is represented in FIG. 2. A filter cell 10 of this kind can be suitable for a DC power supply whose service voltage is lower than 300 volts.

For DC power supplies having operating voltages of higher values, for example 450 volts DC, each capacitor C1, C2 in FIG. 1 has to be replaced by a group of two series-mounted capacitors, because electrochemical capacitors available in the trade generally have a rated voltage of 350 V DC. Distribution of the DC voltages with groups of series-mounted capacitors is achieved in a conventional manner by means of the block diagram of the filter cell 20 illustrated in FIG. 3. The cell 20 comprises four capacitors 12, 14, 16, 18 arranged in two groups of two, connected in parallel to the power supply terminals. Z1 and Z2 represent the partial impedances of the connecting bars for parallel connection of the two groups. The mid-point 22, 24 of each group is connected to a voltage divider 26, with two resistors R having the same value. Each capacitor 12 to 18 is connected to the respective mid-point 22, 24 by a connecting impedance Z3/2. When the direct current flowing through the resistors R is great in relation to the leakage current of the capacitors 12 to 18, each resistive divider 26 imposes the voltage at the mid-point 22, 24 of each group in such a way as to balance the DC voltage at the terminals of the capacitors 12, 14, 16, 18.

A filter bank DC voltage distribution principle of this kind is used in the ALPES 4000 static converter marketed by the applicant. The twin-resistor voltage divider is arranged outside the enclosure housing the elementary capacitors, and is common for all the groups of two series-mounted capacitors. The mid-point of the resistive divider is connected to the respective mid-point of each group of capacitors by an individual electrical connection with an additional resistor. Depending on the power of the converter, each filter cell enclosure comprises a different number of groups of series-mounted capacitors, and of individual wired connections with the common voltage divider. The dimensions of the enclosure are specific for each power, which gives rise to a storage problem.

The same is true of the connecting device with bars connecting the elementary capacitors in parallel. Each filter bank power has corresponding to it a given type of prefabricated connecting device designed to connect a predetermined number of capacitors.

The object of the invention is to avoid the above-mentioned drawbacks and to perfect standardization of the filter banks of a range of power converters.

SUMMARY OF THE INVENTION

The filter bank according to the invention is characterized in that the mechanical support comprises a base made of moulded insulating material, having a quadrilateral profile on which four identical capacitors are mounted forming a standard module with the connecting device equipped with two bars of opposite polarities, and that the voltage divider comprises:
- a first balancing resistor R electrically connected between the mid-point of the first group of capacitors and one of the bars of positive polarity;
- a second balancing resistor R of the same value as the first, and electrically connected between the mid-point of the second group of capacitors and the other bar of negative polarity;
- and an auxiliary connecting impedance Z electrically inserted between the two mid-point of the two groups of capacitors, the value of the impedance Z being chosen so that said mid-points are in parallel for direct current, but are not for the alternating current to be filtered.

The value of the impedance Z must satisfy the relationship $Z3/2 << |Z| << R$, so as to be very small in relation to the value of the first or second resistor R, and very large in relation to the connecting impedance $Z3/2$ present between a mid-point and a capacitor of each group.

Depending on the power of the converter, one or more standard modules are used to constitute a filter bank of a predetermined capacity. The support of each module advantageously comprises coupling means to enable the modules to be modularly assembled together on the four sides of the base. Electrical interconnection between the different juxtaposed modules is achieved simply by means of connecting screws of the bars of the same polarities.

The auxiliary impedance Z of each module is formed by an intermediate metal part of the connecting device, said part being fitted between the two straight bars of opposite polarities, and presenting a central frame connected by two connecting lugs to small end bars.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
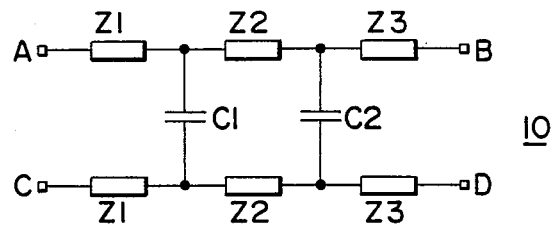
FIGS. 1–3 illustrate a conventional filter cell.
Figure 2:
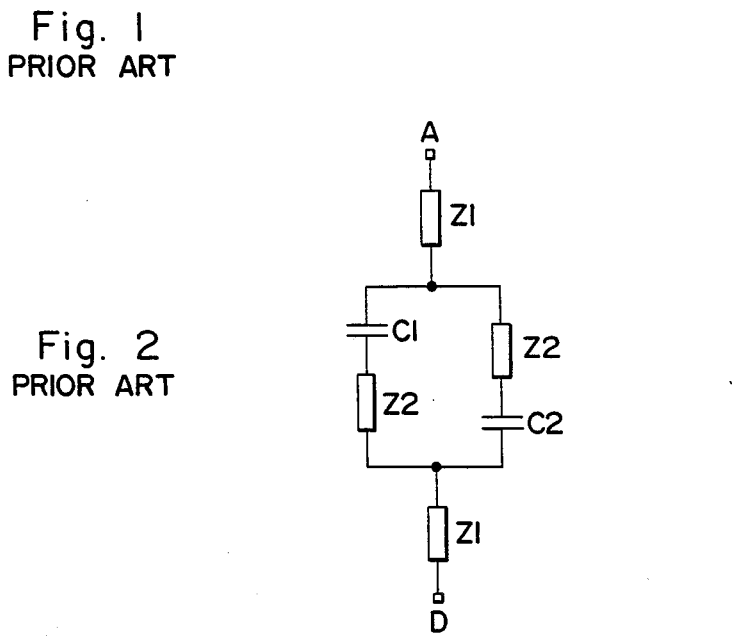
Figure 3:
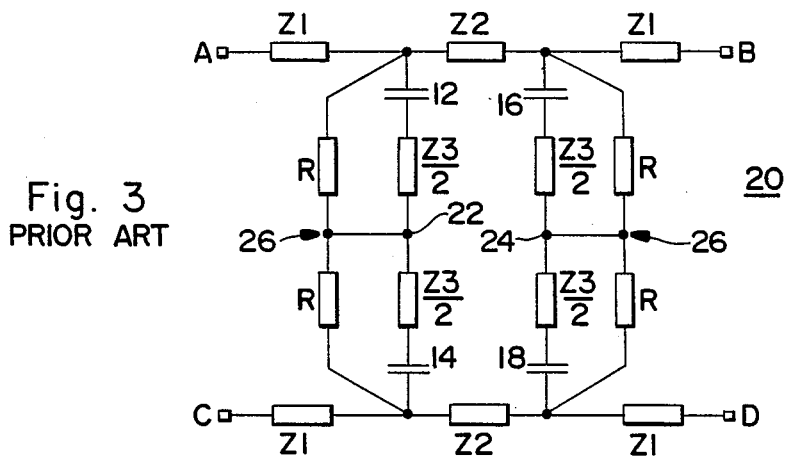
Figure 4:
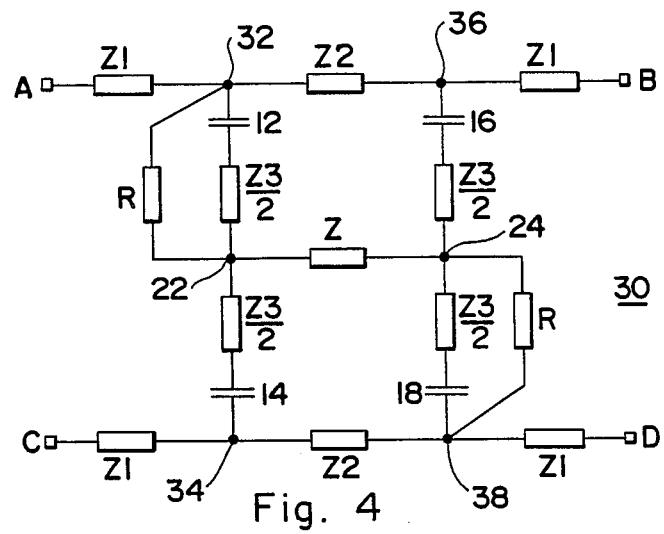
FIG. 4 illustrates the wiring diagram of a filter cell according to the invention.

In FIG. 4, the filter oil cell 30 presents the same configuration as that of FIG. 3 for the arrangement of the capacitors 12 to 18, and of the partial connecting impedances Z1, Z2, Z3. The same reference numbers are used to designate identical elements. Two resistors R of the resistive dividers 26 have been removed, and an auxiliary connecting impedance Z has been electrically inserted between the mid-point 22 and 24. The first group of two capacitors 12, 14 in series is connected between the points 32 and 34, whereas the second group of capacitors 16, 18 is connected between the points 36, 38. A first balancing resistor R of the voltages at the terminals of the capacitors 12 and 14 is inserted between the points 32 and 22, and a second balancing resistor R of the voltages at the terminals of the capacitors 16 and 18 is connected between the points 24 and 38.

The partial impedances Z1 of the connecting device are arranged between the points A and 32; 36 and B; C and 34; 38 and D.

The partial impedances Z2 of the connecting device are located between the connecting points 32 and 36; 34 and 38.

The partial impedances Z3/2 are located between the mid-points 22, 24 and the respective capacitors 12 to 18.

The value of the impedance Z between the mid-points 22 and 24 must respect the relationship (1):

$$/\frac{Z3}{2}/ << /Z/ << R \qquad (1)$$

This results in the mid-points 22 and 24 not being in parallel for the alternating currents to be filtered (first condition Z3/2 very small in relation to $|Z|$), but they are for direct current (second condition $|Z|$ very small in relation to R). The power supply on the cell 30 in FIG. 4 is performed between the points A and D.

Figure 5:
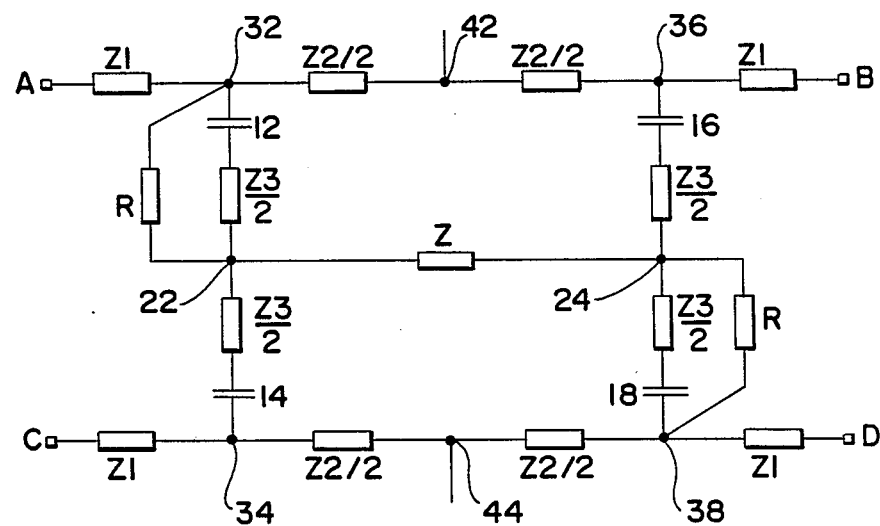
FIG. 5 is an alternative embodiment of FIG. 4.

The filter cell 40 according to FIG. 5 is an alternative embodiment of that in FIG. 4, the power supply being performed at the mid-points 42, 44 of the bars of opposite polarity (middle of Z2). The partial connecting impedances Z2/2 are located on the one hand between the upper power supply point 42 and the connection points 32 and 36, and on the other hand between the lower power supply point 44 and the connection points 34 and 38. The value of the impedance Z is identical to that of the device of FIG. 4, and meets the two-fold condition imposed by the relationship (1).

As an example, each balancing resistor R of one of the filter cells 30 or 40 has a value close to 4,700 ohms, whereas the module of the impedance Z is in the order of a few milliohms.

Figure 6:
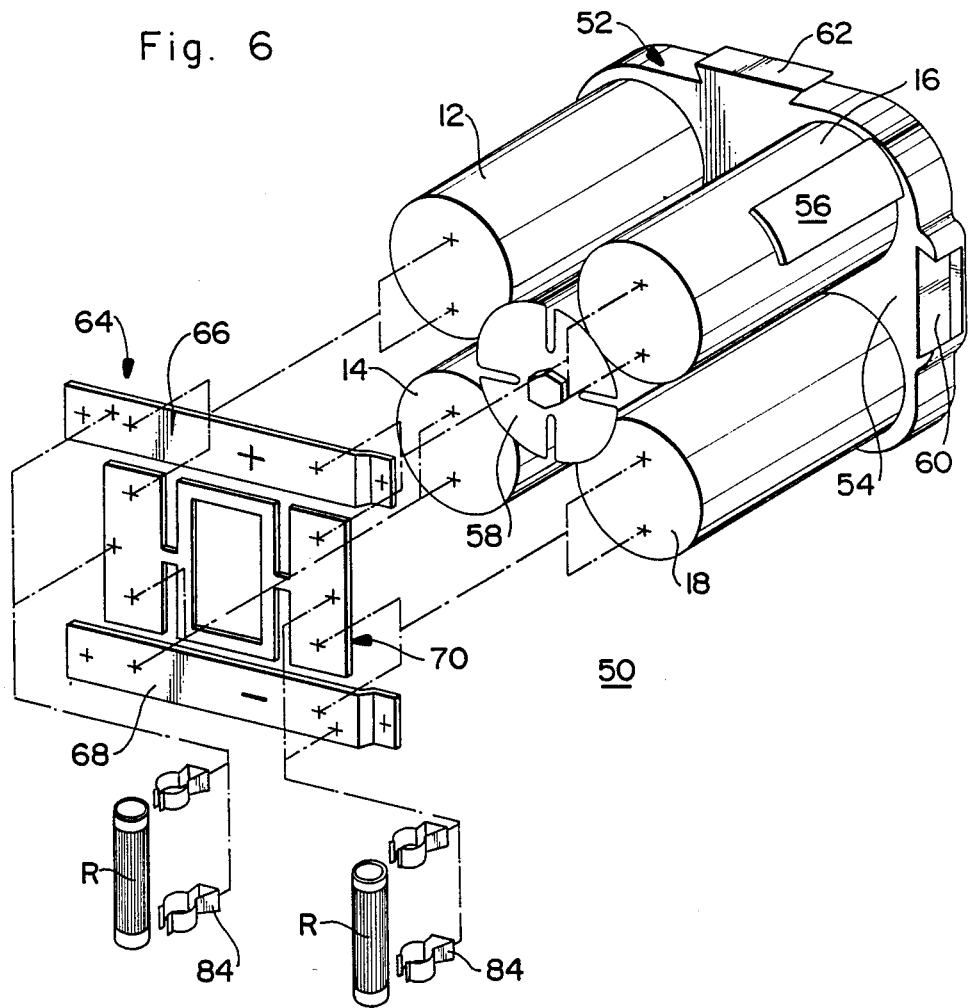
FIG. 6 is an exploded perspective view of a module conforming to the diagram in FIG. 4.
Figure 7:
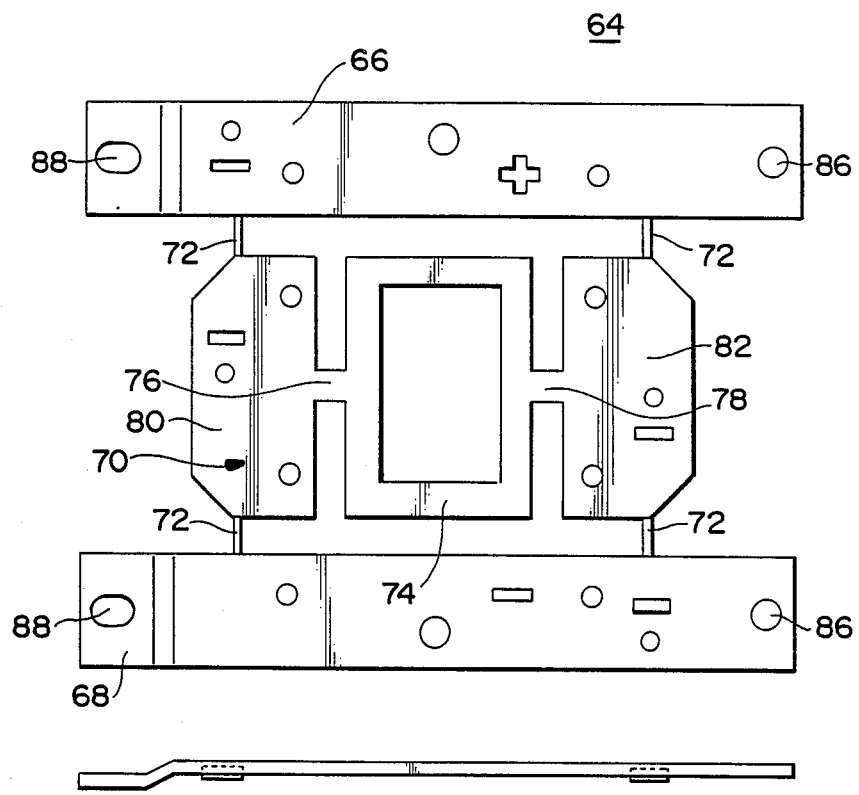
FIG. 7 represents a detailed view of the connecting device of the module in FIG. 6.

FIG. 6 shows the standard module 50 of a filter cell with four capacitors 12 to 18 of identical capacities, the wiring diagram of which corresponds to FIG. 4. The module 50 comprises a mechanical support device 52, made of moulded insulating material, having a quadrilateral, notably square-shaped, base 54 on which the cylindrical coils of the capacitors 12 to 18 are mounted in fours. The base 54 is provided with a plurality of positioning lugs 56 (only one of which can be seen in FIG. 6) of the capacitors 12 to 18, and a central locking device 58 mechanically holds the capacitors against the base 54. The adjacent sides of the base 54 are provided respectively with a dovetail groove 60 and tenon 62 of conjugate shape to enable several identical modules 50 on the four sides of the base 54 to be associated. The connecting device 64 (FIGS. 6 and 7) of the capacitors 12 to 18 of each module 50 presents a standard prefabricated tin-plated aluminium configuration, having two straight bars 66, 68 and an intermediate part 70 putting the two groups of capacitors 12, 14; 16, 18 in parallel. The provisional connection of the intermediate part 70 with the bars 66, 68 is provided by ties 72 (FIG. 7), which are then cut out when the module 50 is assembled. The upper bar 66 of positive polarity corresponds to the conductor AB in the diagram in FIG. 4, and the lower bar 68 of negative polarity corresponds to the conductor CD. The impedance Z is materialized by the special shape of the intermediate part 70 having a central frame 74 connected by two connecting lugs 76, 78 to small end bars 80, 82. Each capacitor 12 to 18 is provided with a pair of connection terminals (see FIG. 6) operating in conjunction with predetermined orifices of the bars 66, 68 and small bars 80, 82 of the connecting device 64. The two balancing resistors R are positioned in clips 84 fixed directly onto the upper face of the connecting device 64 of each module 50. Any wiring by independent wires is thus avoided when the module 50 is prefabricated.

Each bar 66, 68 is provided at its opposite ends with a circular hole 68 and an oblong hole 88 enabling connection with the connecting devices of the adjacent modules.

Figure 8:
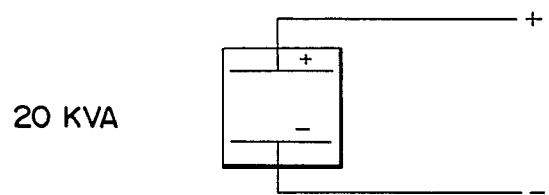
FIG. 8 shows various associations of modules according to the power required.
Figure 8:
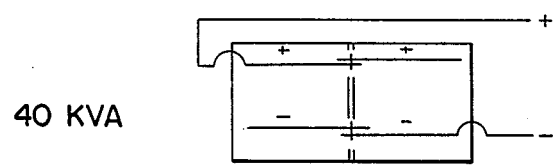
Figure 8:
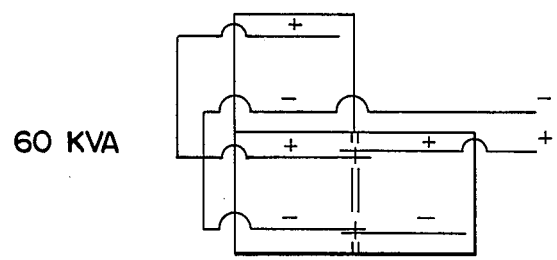
Figure 8:
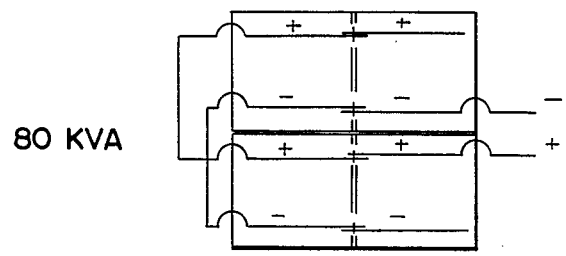

FIG. 8 shows the use of one or more standard modules 50 according to FIG. 6 to constitute filter banks of different capacity depending on the power of the associated converter.

For a power of 20 kVa, a single module 50 with four elementary capacitors 12 to 18 of 2200 microfarads each is sufficient, power supply being achieved according to the diagram in FIG. 5.

A power of 40 kVa requires two identical modules 50 to be fitted together by assembling the respective bases 54 on the same side, followed by interconnection of the bars 66, 68 of the same polarity of the two juxtaposed connecting devices 64.

The filter banks having powers of 60 kVa and 80 kVa are formed respectively by fitting three and four modules 50 together.

The filter banks can be inserted between a rectifier and an inverter.

We claim:

1. A filter unit having power supply terminals for electrical connection to a static power converter for a static power converter, comprising a plurality of electrochemical capacitors formed by coils with parallel axes, positioned on a mechanical support (52), and cooperating at the opposite end with an electrical connecting device (62), said capacitors being divided into first and second groups of capacitors connected in parallel to the power supply terminals, each group comprising at least two series-mounted capacitors (12, 14; 16, 18), having a mid-point (22,24) which is connected to a voltage divider with balancing resistors R, the mechanical support (52) comprising a base (54) made of moulded insulating material, having a quadrilateral profile on which four identical capacitors (12,14; 16,18) are mounted forming a standard module (50) with the connecting device (64) equipped with a first bar (66) of positive polarity, and a second bar (68) of negative polarity, the voltage divider comprising:

a first balancing resistor R electrically connected between the mid-point (22) of the first group of capacitors (12, 14) and the first bar (66) of positive polarity;

a second balancing resistor R of the same value as the first, and electrically connected between the mid-point (24) of the second group of capacitors (16, 18) and the second bar (68) of negative polarity;

and a first connecting impedance Z electrically inserted between the two mid-points (22, 24) of the first and second groups of capacitors, the value of the impedance Z being chosen so that said mid-points (22, 24) are in parallel for direct current, but are not for alternating current to be filtered.

2. The filter unit according to claim 1, having a second connecting impedance Z3/2 connected between the mid-point (22, 24) and the capacitors of the first and second groups, wherein the value of the first impedance Z must satisfy the relationship $Z3/2 << |Z| << R$, in such a way as to be very small in relation to the value of the first or second balanced resistor R, and very large in relation to the second connecting impedance Z3/2.

3. The filter unit according to claim 2, wherein the first impedance Z of each module is formed by an intermediate metal part (70) fitted between the first and second bars (66, 68) of said connecting device (64), and presenting a central frame (74) connected by two connecting lugs (76, 78) to small end bars (80, 82).

4. The filter unit according to claim 1, wherein the first and second balancing resistors R of each module (50) are positioned in clips (84) fixed directly onto the upper face of the connecting device (64).

5. The filter unit according to claim 1, wherein the mechanical support (52) of the four capacitors (12 to 18) of each module (50) comprises a base (54) having four sides provided with coupling means (60, 62) to enable modular assembly by associating several identical modules, each first and second bar (66, 68) of the connecting device (64) being straight and comprising holes (86, 88) at the opposite ends for electrical connection with the juxtaposed bars of the same polarities of the adjoining modules.

6. The filter unit according to claim 1, each capacitor having the shape of a cylindrical coil, wherein the four capacitors (12 to 18) are held on the base (54) by a central locking device (58) disposed in the mid-plane of the module (50).

7. The filter unit according to claim 1, wherein the connecting device (64) with bars is prefabricated and made of tin-plated aluminium.

* * * * *